(12) United States Patent
Coglitore et al.

(10) Patent No.: US 9,733,850 B2
(45) Date of Patent: *Aug. 15, 2017

(54) OPTICAL COLD STORAGE WITH ENCODING AND PLACEMENT OF DATA CHUNKS ON DIFFERENT OPTICAL DISKS

(71) Applicant: Facebook, Inc., Menlo Park, CA (US)

(72) Inventors: Giovanni Coglitore, Saratoga, CA (US); Narsing Vijayrao, Santa Clara, CA (US); Kestutis Patiejunas, Sammamish, WA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/281,691

(22) Filed: Sep. 30, 2016

(65) Prior Publication Data
US 2017/0017427 A1    Jan. 19, 2017

Related U.S. Application Data

(63) Continuation of application No. 14/531,312, filed on Nov. 3, 2014, now Pat. No. 9,483,200.

(51) Int. Cl.
*G06F 3/00* (2006.01)
*G06F 3/06* (2006.01)
(Continued)

(52) U.S. Cl.
CPC ......... *G06F 3/0619* (2013.01); *G06F 3/0608* (2013.01); *G06F 3/0643* (2013.01);
(Continued)

(58) Field of Classification Search
CPC .. G06F 11/1451; G06F 3/0619; G06F 3/0643; G06F 3/0608
(Continued)

(56) References Cited

U.S. PATENT DOCUMENTS 8,140,786 B2 * 3/2012 Bunte ................ G06F 11/1451
                                                                711/161
9,323,615 B2   4/2016 Cypher et al.
(Continued)

OTHER PUBLICATIONS

Corrected Notice of Allowability mailed Aug. 25, 2016, for U.S. Appl. No. 14/531,312 by Coglitore, G., et al. filed Nov. 3, 2014.
(Continued)

*Primary Examiner* — Tammara Peyton
(74) *Attorney, Agent, or Firm* — Perkins Coie LLP

(57) ABSTRACT

Various embodiments ("systems") are described for transferring data from a primary storage (e.g., magnetic disk drives, solid state drives, etc.) to an optical cold storage rack. The optical cold storage rack may include many physical optical storage disks, but a much smaller number of burners and readers (e.g., optical disk drives). When data is to be transferred to the optical cold storage rack, the system may generate a plan for performing the transfer. "Migration worker" components may then implement the plan and may be exclusively dedicated to implementing such plans. In various embodiments, the plan may specify how large data file "aggregates" (collections of portions of one or more data files) are to be distributed across optical disks ("disks") to improve throughput during subsequent reading operations from the optical cold storage rack. The plan may also anticipate the relation between the limited number of burners/readers and the overall optical cold storage rack disk capacity.

18 Claims, 12 Drawing Sheets

(51) Int. Cl.
  *G06F 13/10* (2006.01)
  *G06F 11/10* (2006.01)
  *H03M 13/15* (2006.01)
  *G11B 27/00* (2006.01)
  *G06F 11/14* (2006.01)

(52) U.S. Cl.
  CPC .......... *G06F 3/0647* (2013.01); *G06F 3/0665* (2013.01); *G06F 3/0683* (2013.01); *G06F 3/0686* (2013.01); *G06F 3/0689* (2013.01); *G06F 11/1092* (2013.01); *G06F 13/102* (2013.01); *G11B 27/00* (2013.01); *G11B 27/002* (2013.01); *H03M 13/1515* (2013.01); *G06F 11/1451* (2013.01); *G06F 2201/80* (2013.01); *G11B 2220/45* (2013.01)

(58) Field of Classification Search
  USPC ...................................... 710/72–74; 711/161
  See application file for complete search history.

(56) References Cited

U.S. PATENT DOCUMENTS

| | | |
|---|---|---|
| 9,483,200 B2 | 11/2016 | Coglitore et al. |
| 2008/0222480 A1 | 9/2008 | Huang et al. |
| 2012/0290878 A1 | 11/2012 | Gladwin et al. |
| 2016/0124677 A1 | 5/2016 | Coglitore et al. |

OTHER PUBLICATIONS

Non-Final Office Action mailed Jan. 12, 2016, for U.S. Appl. No. 14/531,312 by Coglitore, G., et al. filed Nov. 3, 2014.
Notice of Allowance mailed Jul. 29, 2016, for U.S. Appl. No. 14/531,312 by Coglitore, G., et al. filed Nov. 3, 2014.
U.S. Appl. No. 14/531,312 by Coglitore, G., et al. filed Nov. 3, 2014.
U.S. Appl. No. 15/171,293 by Parekh, R., et al. filed Jun. 2, 2016.

\* cited by examiner

305

| | 1:240 HDD | | |
|---|---|---|---|
| 1U | Empty | | |
| 1U | Empty | | |
| 2U | Empty | Web Server | Empty |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |
| 3U | Power Shelf | | |
| 2U | Empty | Web Server | Empty |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |
| 2U | Cold Storage | | |

*FIG. 3*

OPTICAL COLD STORAGE WITH ENCODING AND PLACEMENT OF DATA CHUNKS ON DIFFERENT OPTICAL DISKS

CROSS-REFERENCE TO RELATED APPLICATIONS

This application is a continuation of U.S. patent application Ser. No. 14/531,312, entitled "SYSTEM AND METHOD FOR OPTICAL COLD STORAGE WHEREIN PLURALITY OF FIRST AND SECOND CHUNKS ARE ENCODED AND PLACED ON DIFFERENT OPTICAL DISKS," filed on Nov. 3, 2014, which is incorporated herein by reference in its entirety.

BACKGROUND

Disparate technical and business objectives can make it difficult for businesses and other entities ("institutions") to store and safeguard large volumes of data. For example, the software and hardware applications servicing an institution's primary storage system may need to provide redundancy across different hardware platforms, determine appropriate timings for the storage and retrieval of data, and allocate data in a structured manner. These technical considerations can also be complicated by business objectives. For example, where the organization deals in sensitive personal information it may be necessary for definitive measures for erasing data in storage to be readily available.

Optical data storage systems provide some benefits that may address various of these technical and business needs. For example, an optical disk may not require any power until it is placed into an optical disk drive ("drive") so that data can be read or written. However, successful integration of optical storage into an operational database system demands that the nuances of the optical storage and the existing storage systems be fully considered.

For example, success regularly depends upon the harmonious integration of factors such as data retention policies, privacy policies, storage operations, encoding protocols, etc. Rather than joining disparate collections of tools at different levels of abstraction, an optical storage system would ideally synthesize these elements for a common purpose. Typical optical storage systems fail to provide this integrated functionality or to achieve the consequent efficiency gains.

BRIEF DESCRIPTION OF THE DRAWINGS

The techniques introduced here may be better understood by referring to the following Detailed Description in conjunction with the accompanying drawings, in which like reference numerals indicate identical or functionally similar elements:

FIG. 3 is a block diagram illustrating elements in an example optical storage rack as may occur in some embodiments.

Figure 1:
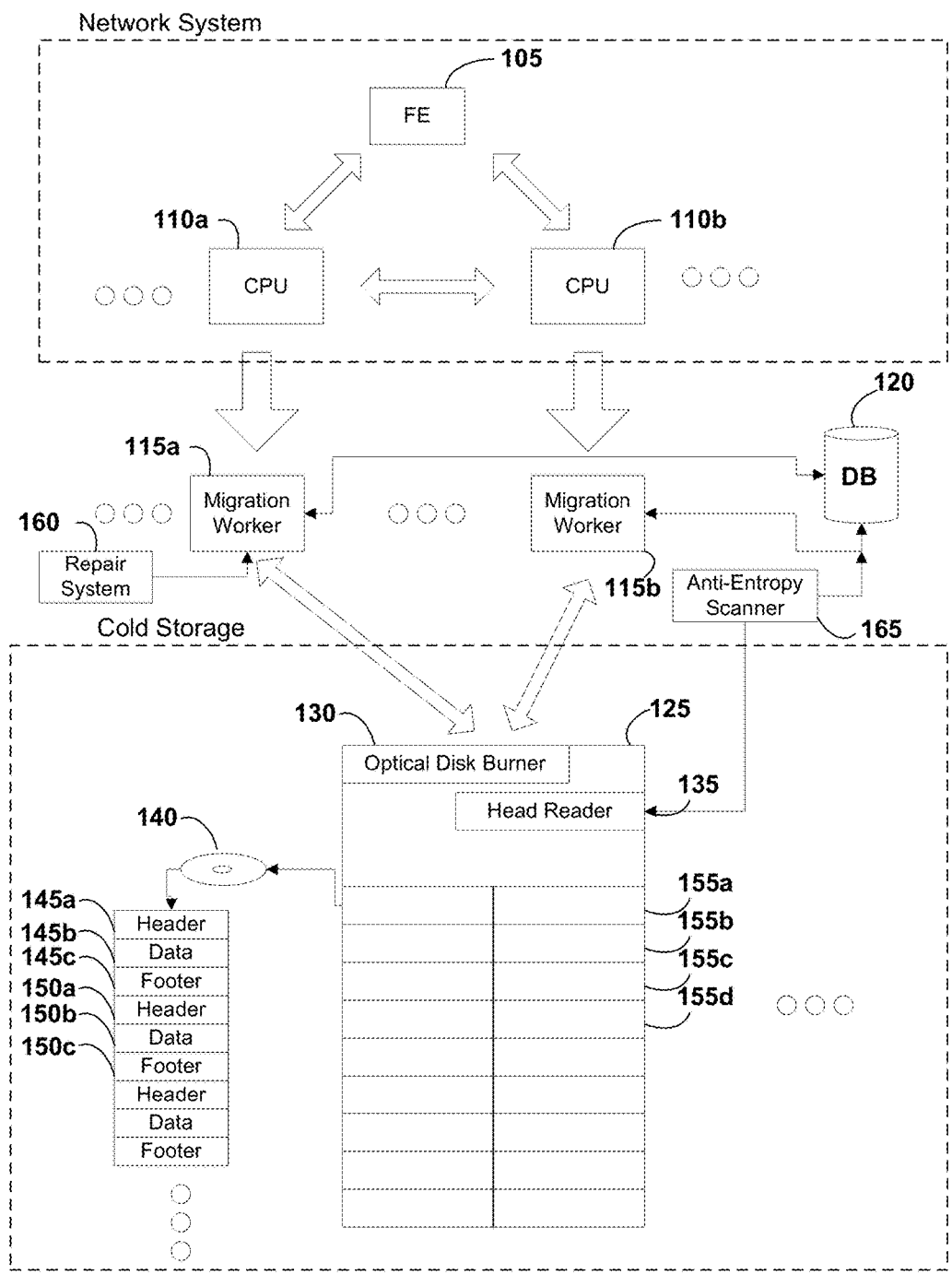
FIG. 1 is a block diagram illustrating elements in a primary and optical storage topology as may occur in some embodiments.

While the flow and sequence diagrams presented herein show an organization designed to make them more comprehensible by a human reader, those skilled in the art will appreciate that actual data structures used to store this information may differ from what is shown, in that they, for example, may be organized in a different manner; may contain more or less information than shown; may be compressed and/or encrypted; etc.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Similarly, some components and/or operations may be separated into different blocks or combined into a single block for the purposes of discussion of some of the embodiments. Moreover, while the various embodiments are amenable to various modifications and alternative forms, specific embodiments have been shown by way of example in the drawings and are described in detail below. The intention, however, is not to limit the particular embodiments described. On the contrary, the embodiments are intended to cover all modifications, equivalents, and alternatives falling within the scope of the disclosed embodiments as defined by the appended claims.

DETAILED DESCRIPTION

Various embodiments ("systems") are described for transferring data from a primary storage (e.g., magnetic disk drives, solid state drives, etc.) to an optical cold storage rack. The optical cold storage rack may include many physical optical storage disks, but a much smaller number of burners and readers (e.g., optical disk drives). When data is to be transferred to the optical cold storage rack, the system may generate a plan for performing the transfer. "Migration worker" components may then implement the plan and may be exclusively dedicated to implementing such plans. In various embodiments, the plan may specify how large data file "aggregates" (collections of portions of one or more data files) are to be distributed across optical disks ("disks") to improve throughput during subsequent reading operations from the optical cold storage rack. The plan may also anticipate the relation between the limited number of burners/readers and the overall optical cold storage rack disk capacity. Header and footer metadata may be appended to each file portion stored in the optical cold storage rack disks to facilitate recovery. The metadata may indicate the location and relationship of other file portions related to this file portion. Methods for efficiently deleting data from the optical cold storage rack so as to comply with various data retention and/or privacy policies are also provided in various embodiments.

Various examples of the disclosed techniques will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the techniques can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the embodiments. Indeed, certain terms may even be emphasized below; however, any terminology intended to be interpreted in any restricted manner will be overtly and specifically defined as such in this section.

Overview—Example Topology

Turning now to the figures, FIG. 1 is a block diagram illustrating elements in a primary and optical storage topology as may occur in some embodiments. A primary storage system may include a file system entity 105 in communication with a plurality of processing systems 110a,b. Though referred to herein as a "primary storage system", the system may simply reflect the storage devices upon which the enterprise would depend absent the existence of the optical storage. Accordingly, the "primary storage system" may simply be a collection of local hard drives employed by the enterprise during normal operations. However, the "primary storage system" may also reflect a hard disk drive-based cold storage system and may or may not be networked with other computer devices.

The data in the primary storage system may originally be stored in a hard disk drive ("hard drive") storage for ready access. The processing systems 110a,b may determine (e.g., periodically or based on a specified schedule) that data from the primary storage system is to be stored in, or retrieved from, the optical storage racks. When such a determination is made, the processing systems 110a,b may provide instructions to one or more migration workers 115a,b. Either the processing systems 110a,b or migration workers 115a,b may create a "plan" depicting the operations necessary to fulfill the instruction. The plan may then be implemented by one or more migration workers 115a,b.

A migration worker 115a,b may be one or more dedicated process on a machine connected to a network (e.g., a computing machine such as a router or switch), or it may be one or more processes operating on one or more separate machines. Each migration worker 115a,b may determine a series of actions necessary to perform a portion of the plan. Migration workers 115a,b may distribute the portions of the plan amongst themselves, or be assigned portions directly by the processing systems 110a,b. The migration worker 115a,b may read and write data from hard drives in the primary storage system. In some embodiments, the migration worker 115a,b may apply Reed-Solomon (RS) encoding to data transmitted to the optical storage system. RS encoding may facilitate the recovery of data even if one or more of the optical disks fail.

The migration workers 115a,b may consult a database 120 as part of the plan execution. Each migration worker 115a,b may then selectively direct the read and write operations at one or more optical disk burners 130 and readers 135 across one or more optical storage racks 125. For example, in the event that a database (e.g., file allocation table) becomes corrupt or otherwise unavailable, it can be rebuilt using the data stored in the headers and footers.

Each optical storage rack 125 may include a finite number of burners 130 and/or readers 135, having limited processing ability. For example, there may be twelve burners each able to operate at 20 MB per second. Each of the burners 130 and readers 135 may be able to operate on one or more disks 155a-d. An example disk 140, may include data stored in a plurality of header 145a, 150a, footer 145c, 150c, and data 145b, 150b partitions. The header 145a, 150a and footer 145c, 150c partitions may indicate where related chunks of data (e.g., portions of the file aggregates) found in the data partitions 145b, 150b may be found in the optical storage system.

The optical storage system may include Write Once Read Many (WORM) technology, and may operate on a low-cost and high-density optical media. The optical system may consist of a robotic arm fitted into a server rack stacked with optical media storage and one or more optical media drives. The optical cold storage system may employ optical disk drives or optical disks that are not rewritable to further reduce the total cost of operations (TCO).

A repair system 160 may work with the migration workers to verify integrity of the disks throughout operations. An Anti-Entropy scanner 165 may also communicate with the database and the optical storage to detect errors.

Example Optical Storage Component Topology

Figure 2:
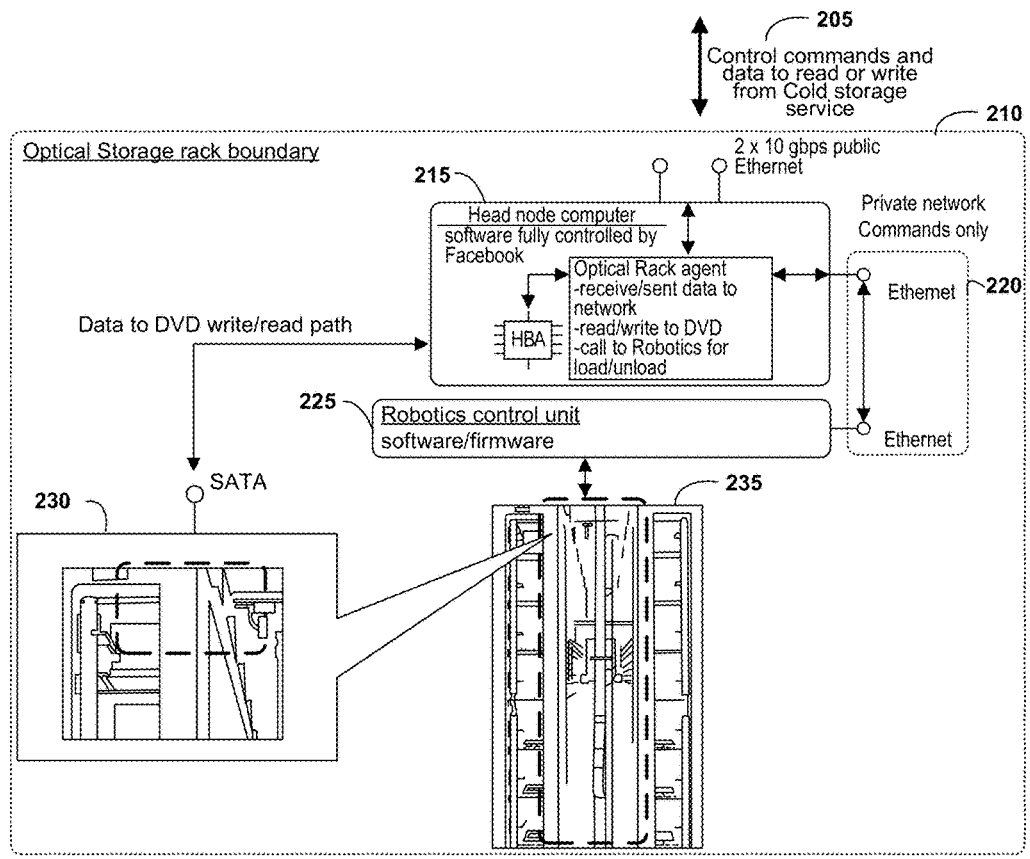
FIG. 2 is a block diagram illustrating elements in an optical storage read and write system as may occur in some embodiments.

FIG. 2 is a block diagram illustrating elements in an optical storage read and write system as may occur in some embodiments. Control commands 205 to read and/or write from the optical storage system 210 may be received from one or more migration workers. An Ethernet connection 220 may be used to interface a head node computer 215 with a robotics control unit 225. The robotics control unit 225 may direct a mechanical actuator to traverse the stacks of disks 235 and to place a disk in a drive for reading/writing as requested. For example, the robotics control unit 225 may direct the mechanical actuator to place one or more disks into optical burners and readers 230 located in the optical storage system 210. The head node computer 215 may direct the reading and writing of the burners/readers 230.

Various of the disclosed configurations may increase write/read speeds and increase availability (some racks/burners can be down). The configurations may also increase durability (e.g., lowering the risk of losing data). The time to load media may be reduced to ~30 s. In some embodiments, loadings may also be amortized for reading/writing big data sets (full disks). The input-output speed may also be improved. Some embodiments may parallelize reads/writes to multiple drives.

In some implementations, the optical rack may have twelve burners or 1.2 TB of active storage. An HDD rack may have 32 active HDDs or 128 TB of active storage. The write/read strategy may include clustering of the data across time and spread across multiple racks.

FIG. 3 is a block diagram illustrating elements in an example optical storage rack 305 as may occur in some embodiments. The rack may contain several cold storage dedicated shelves, a power shelf for providing a power interface, and shelf having a web server.

In some embodiments there may be high HDD aggregation via the configuration. A space re-balancer may be employed to dynamically adjust the data distribution. The re-balancer may be non real-time and may run when needed. The re-balancer may move volumes to new hardware, to even out real-time load.

Example Physical and Logical Optical Storage Topology

Figure 4:
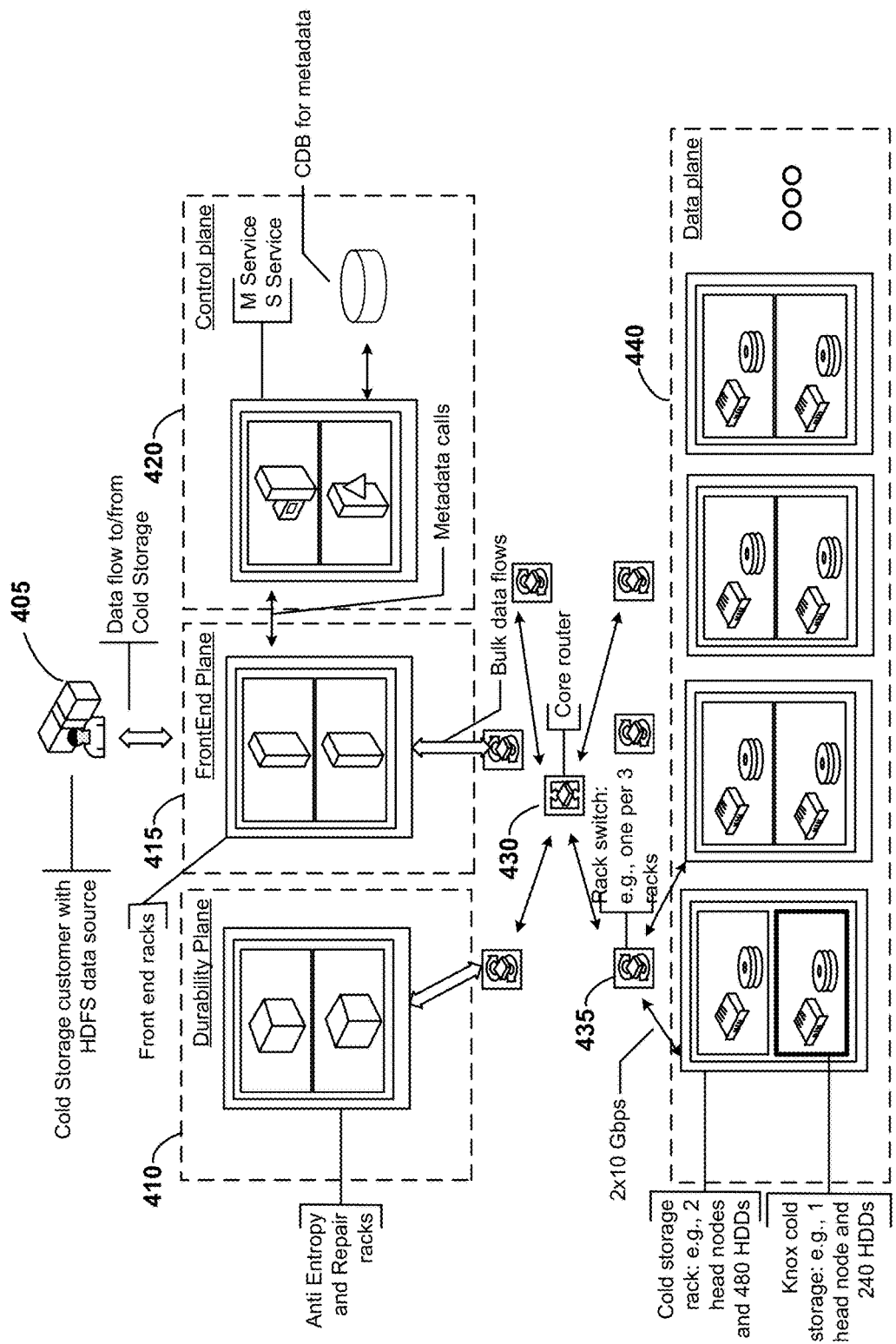
FIG. 4 is a block diagram illustrating a topology of various logical and physical elements in an optical storage system as may occur some embodiments.

FIG. 4 is a block diagram illustrating the topology of various logical and physical elements in an optical storage system as may occur some embodiments. A customer system 405 with storage needs may interface with a primary storage system having a Durability 410, a FrontEnd 415, and a Control 420 plane. The FrontEnd 415 may include one or more migration workers 115a,b in some embodiments, or may reference migration workers in a separate "migration" plane.

The customer system 405 may indicate a desired action to a system in the FrontEnd plane 415. The migration workers may calculate the size and determine a portion of the plan to execute. RS encoding may be used to encode data stored in the optical storage to mitigate errors. The customer system 405 may provide and request data from the system. These requests for data to be returned and for data to be written may be received at a FrontEnd Plane 415 (the "FrontEnd plane" may include a web/tier interface such as may be presented to an external computer). The FrontEnd Plane 415 may communicate with a Durability Plane 410 via front end racks, and via a Control Plane 420 via metadata calls. Data may flow to the FrontEnd Plane 415 and Durability Plane 410 via a core router 430 and rack switch 435. The rack switch 435 may control data flow from one or more racks located in the data plane 440.

Each storage node may include a head node having multiple processors or cores, e.g., 32 cores, 146 GB RAM, and/or 10 Gbps Ethernet. One will recognize that various other computing device specifications may be equally suitable. In some embodiments, there may be one HDD active per tray.

Example Physical and Logical Components and Interfaces

Figure 5:
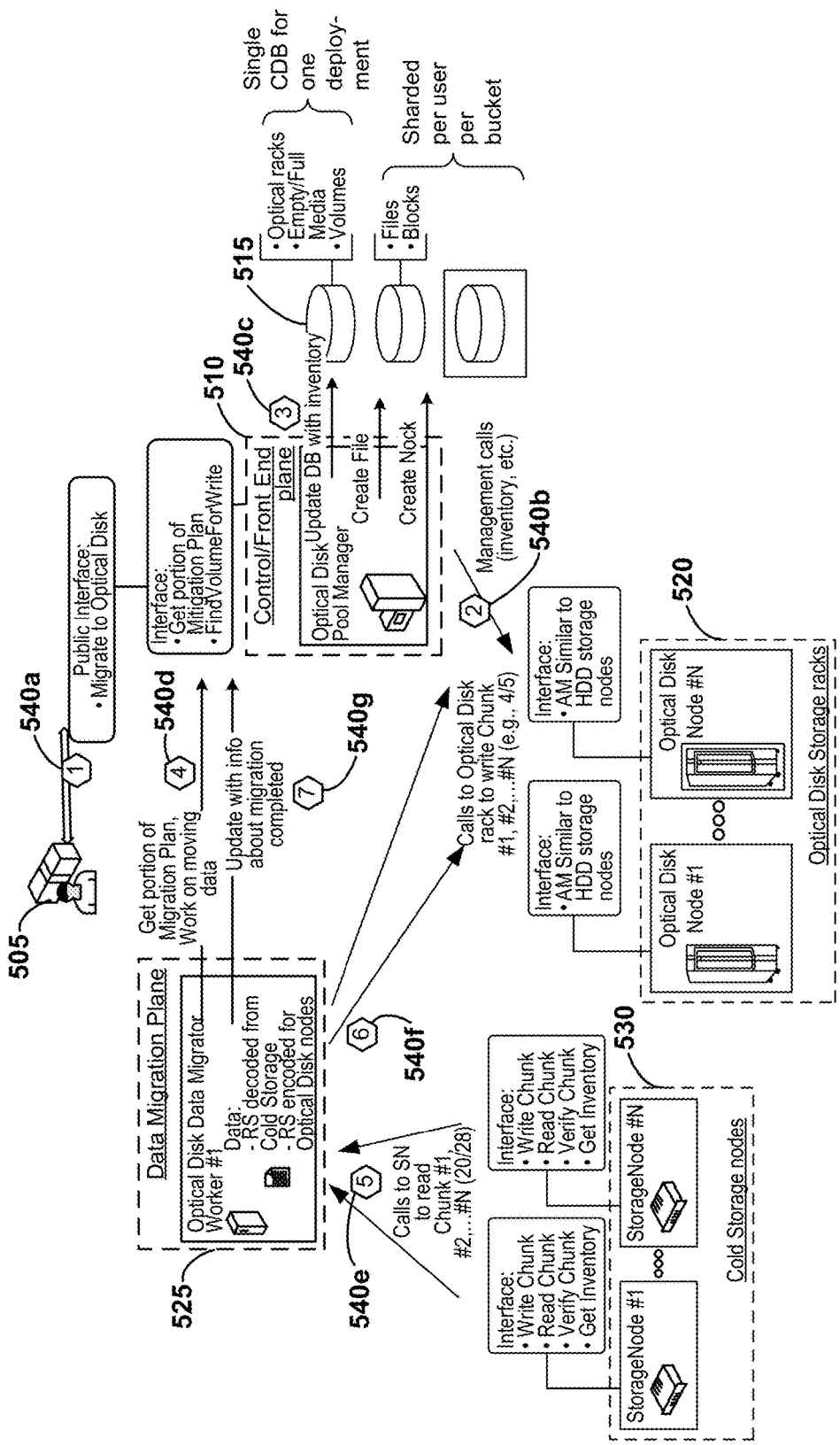
FIG. 5 is a block diagram illustrating various logical and physical components and interfaces used in a write operation as may be implemented in some embodiments.

FIG. 5 is a block diagram illustrating various logical and physical components and interfaces used in a write operation as may be implemented in some embodiments. Initially, a primary storage system 505 may determine that data is to be written to cold storage. The primary storage system 505 may convey 540a this request to the control/front end plane primary storage system 510. The control/front end plane primary storage system 510 may make preliminary management calls 540b to the optical storage system 520 to verify the structure the relevant information. This information may be stored 540c for reference in local databases 515 and used for creation of the plan.

One or more migration workers 525 may then acquire the plan 540d. Referencing the plan, the migration workers 525 may then consult 540e various hard drive storages 530 to acquire the desired chunks of data. The migration workers 525 may then make calls 540f (e.g., by invoking various data storage calls, e.g., via an application programming interface) to the optical storage to write the chunks in accordance with the plan.

Example Flow Process for Performing a Data Transition

Figure 6:
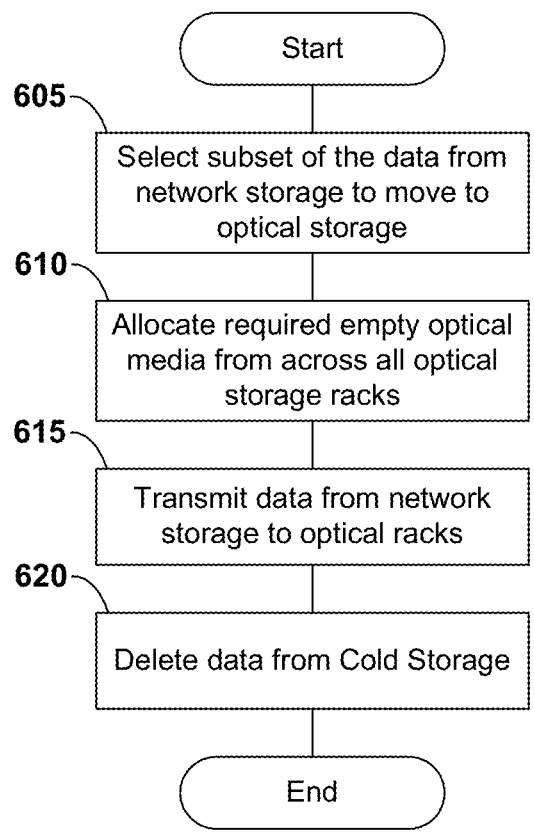
FIG. 6 is a flow diagram illustrating a process for performing a data transition as may be implemented in some embodiments.

FIG. 6 is a flow diagram illustrating a process for performing a data transition (e.g., from a an enterprise hard disk system into the optical cold storage system) as may be implemented in some embodiments. At block 605, the primary storage system may select a subset of the data to move from the primary storage to the optical cold storage. At block 610, a migration worker may allocate the required empty optical media from across all the optical racks. At block 615, a migration worker may transmit data from the primary storage to the optical racks. At block 620, a migration worker may direct the primary storage to delete the data, if the transfer is to move, rather than copy, the data.

Example Logical and Physical Structure Relations

Figure 7:
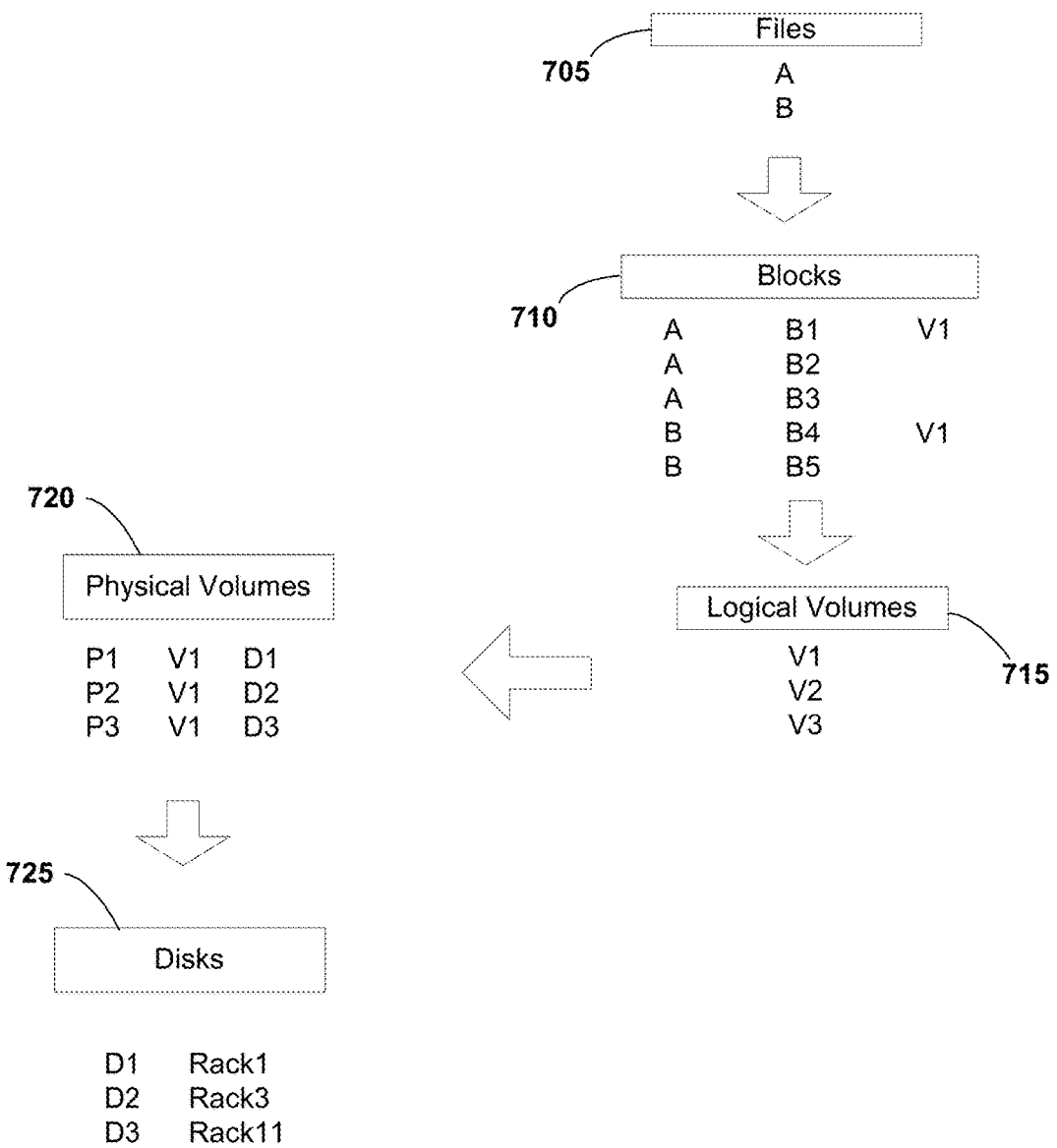
FIG. 7 is a block diagram illustrating an example schema between various logical and physical structures as may occur in some embodiments.

FIG. 7 is a block diagram illustrating an example schema between various logical and physical structures as may occur in some embodiments. Files 705 received from the primary storage system may contain chunks, in this example, A and B. The chunks may not be an explicit part of the file, but may be determined by a migration worker, or the primary system, after assessing the file. The migration worker may determine the chunk size based upon the disk availability, the Reed Solomon implementation to be applied, and related factors.

The migration worker may associate the file chunks with blocks 710, which are themselves associated with logical volumes 715. In this example, file chunk A is associated with blocks B1, B2, and B3. File chunk B is associated with blocks B4, and B5. Each of Blocks B1-B5 are associated with Volume 1 in this example. Logical volumes 715 may be associated with physical volumes 720 on the optical disks. In this example, each of the physical volumes P1-P3 is associated with the same logical volume V1. The physical volumes may be associated with disks. Here, physical volume P1 is found on disk D1, physical volume P2 on disk D2, and physical volume P3 on disk D3. The disks 725 may be found on different racks in the optical storage. For example, here disk D1 appears on rack Rack1, disk D2 on rack Rack3, and disk D3 on rack Rack11.

Thus, primary storage system requests a file from an optical storage, the system can cause a migration worker to implement a plan to identify the appropriate disks and racks based upon the chunks in the file. Linear programming and other optimizations may be used to identify the best timing and order in which to request that each disk be read from the respective rack.

Example File Allocation

Figure 8:
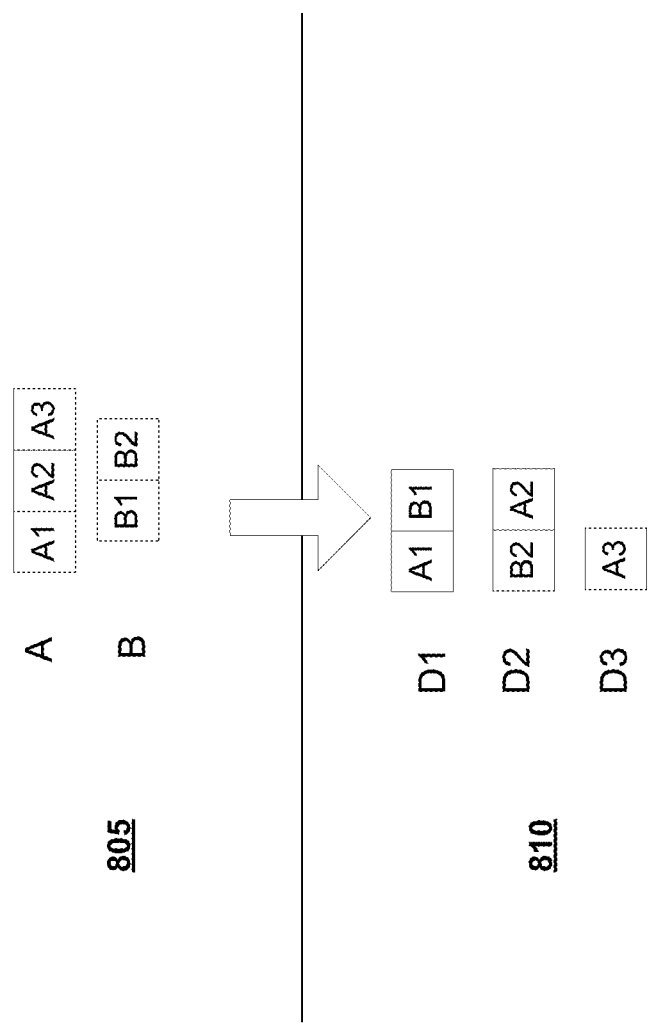
FIG. 8 is a block diagram illustrating the allocation of file portions to storage blocks in accordance with a Reed Solomon (RS) encoding as may occur in some embodiments.

FIG. 8 is a block diagram illustrating the allocation of file portions to storage blocks as may occur in some embodiments. When optimizing for one file, all the bytes in the file may be placed on a single disk. In contrast, when optimizing for many files, portions of the files may be mixed and placed on separate disks to mitigate the risk of a single catastrophic failure. Indexing between the disparately stored file portions may be based upon data availability.

In the illustrated example, a file A in primary storage includes three chunks A1, A2, and A3. A file B in primary storage includes the chunks B1, B2. When directed to write the files A and B to optical storage, the system may generate a plan to intersperse the disk writes, such that the chunks are readily accessible. For example, the first disk D1 may receive the chunk A1 and then the chunk B1. A second disk D2 may receive the chunk B2 and then the chunk A2. Finally a disk D3 may receive the chunk A3. By separating the chunks in the depicted manner, the read time for many files may be improved. If all the chunks associated with a single file were stored on the same disk, not only would this reduce the efficacy of the RS encoding, but it would require that individual disks be separately handled for each file request.

A header and a footer may be appended to each chunk as it appears in the respective disks D1-D3. For example, the header of the chunk A1 as it appears in D1 may indicate the length of the data in A1 found in D1. The header may also indicate the disks where each of the chunks A2 and A3 are located and the respective offsets at which they may be found. RS encoding may be used across all the disks to facilitate recovery should any one disk be lost or destroyed. RS encoding may be applied to each chunk in isolation as well.

Example Migration Worker Coordination

Figure 9:
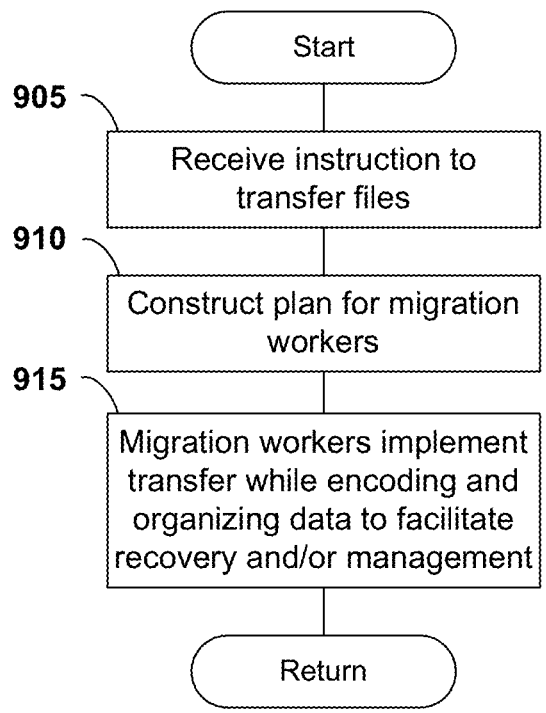
FIG. 9 is a flow diagram illustrating a process for coordinating migration workers as may be implemented in some embodiments.

FIG. 9 is a flow diagram illustrating a process for coordinating migration workers as may be implemented in some embodiments. At block 905, a migration worker may receive instructions to transfer files. The instructions may not be provided in the context of the optical storage layout, e.g., instead specifying simply a file name to retrieve and/or data to be written to a given file. Accordingly, the onus may be on the migration worker to implement the instructions in the existing context.

At block 910, the migration worker may construct a plan (though in some embodiments the plan be separately generated and provided to the migration worker). The plan may anticipate both the character of the instructions and the character of the existing optical storage context. For example, the burners and readers in the optical storage may have a finite capacity and may already be allocated to other requests. The migration worker may identify portions of files residing on disks which will be retrieved according the existing operations. Rather than specify separate requests, the migration worker can then wait for these disks to be retrieved and then request a supplemental operation. For example, the robotics control unit 225 may retain a queue of operations to be performed. The migration worker may direct the node computer 215 to insert operations in fulfillment of the determined plan alongside existing operations in the queue.

At block 915, the migration workers may implement the transfer while encoding and/or organizing data to facilitate recovery and/or management. For example, if the instructions request that a new file be created, or that new data be written to a file, the migration worker may RS encode chunks in the file affected by the modification to facilitate error detection and correction.

Example Migration Worker Plan Implementation

Figure 10:
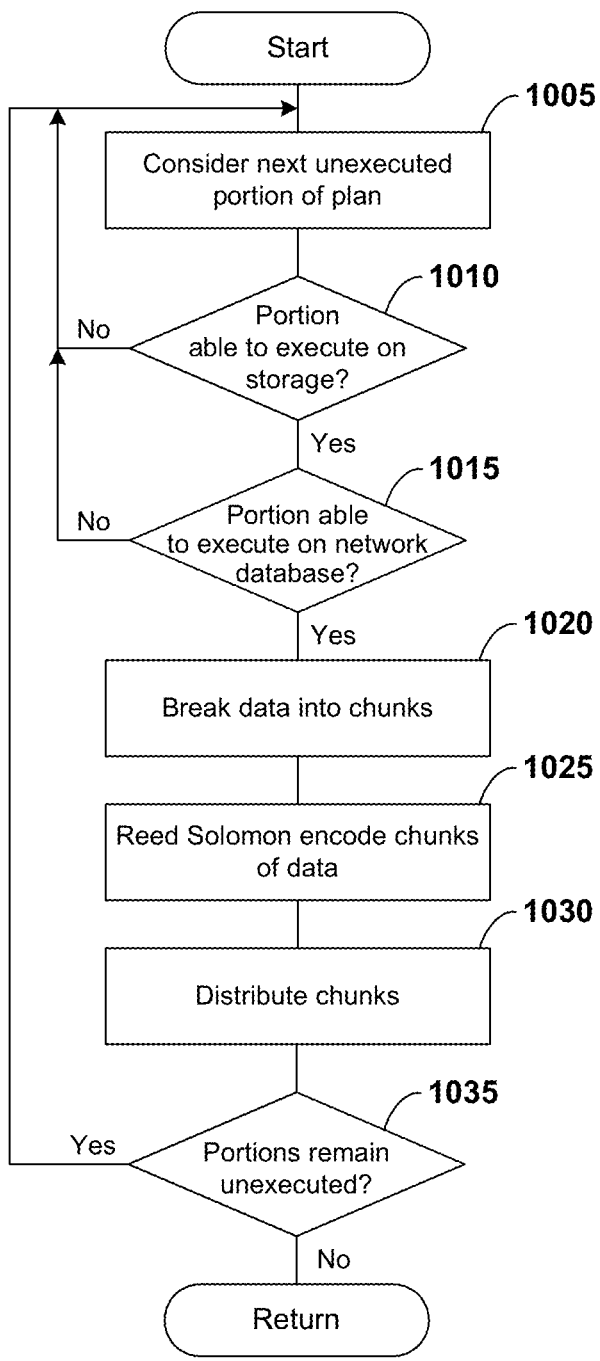
FIG. 10 is a flow diagram illustrating a process operating on a migration worker for implementing at least a portion of a plan as may occur in some embodiments.

FIG. 10 is a flow diagram illustrating a process operating on a migration worker for implementing at least a portion of a plan as may occur in some embodiments. In this example, the plan is directed to creating, or modifying, a file in the optical storage.

At block 1005, the system may consider the next unexecuted portion of a plan. If the portion is able to be executed on the optical storage at block 1010, e.g., if the necessary readers and disks are not available, then the system may wait for a more suitable time. Similarly, if at block 1015 the migration worker determines that a required portion of the network database is unavailable, the migration worker may proceed to the next portion. For example, just as the optical network is not always available, the hard drives on the primary storage may not always be available as well. Though not depicted in this example, the operations at the primary storage and at the optical storage need not proceed together. The migration worker may, e.g., retrieve data from the optical storage regardless of the primary storage's availability, and store the data. Once the primary storage becomes available, the data may be transferred. For example, the primary storage may be accessible over a network, or have a finite number of input/out interfaces.

When it is possible to perform the requested operation, the migration worker may break the file into chunks at block 1020 (although in some embodiments the primary storage may have performed this operation in advance). At block 1025, the migration worker may then encode the chunks of data, e.g., using RS encoding. At block 1030, the migration worker may direct the optical storage, e.g., via the robotics control unit 225, to distribute the file chunks across the various storage disks. If portions of the plan remain unexecuted at block 1035, the system may consider the next unexecuted portion.

While a greedy approach is presented in FIG. 10, more forward-looking embodiments are also considered, wherein the migration worker anticipates future portions of the plan to economize upon the requirements of preceding portions. For example, where a subsequent portion of the plan requires a disk access, if the same disk is to be accessed previously, the necessary modifications for both portions may be performed upon the first access.

Example Storage Verification

Figure 11:
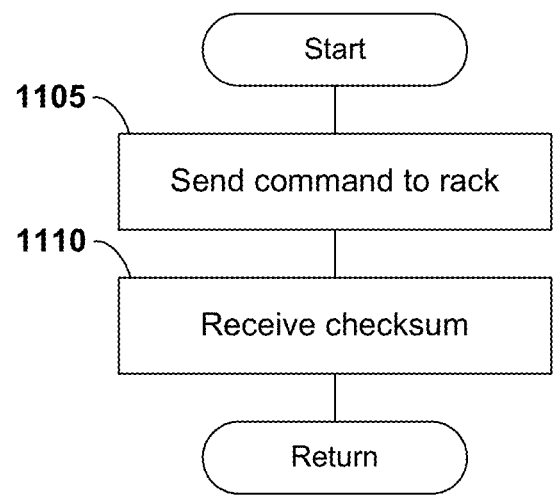
FIG. 11 is a flow diagram illustrating a process for verifying storage operation completion as may occur in some embodiments.

FIG. 11 is a flow diagram illustrating a process for coordinating migration workers as may be implemented in some embodiments. The migration worker may send a command 1105 to the optical storage rack and receive a checksum 1110 in response. The checksum may reflect a verification of the Reed Solomon encoding results. The optical storage rack may then return a checksum. Reed Solomon encoding may allow the chunks to be broken up by the migration workers. Though Reed Solomon encoding is frequently referenced herein to facilitate understanding, one will recognize that other encoding methods may be applied in some embodiments.

Privacy and Deletion Considerations

Upon a request from the primary storage to delete a dataset, the optical storage may overwrite the data in each rack (e.g., writing 1's at each bit). An encryption key may be stored in the database and used to encrypt data as it is written to the optical storage. When a deletion is requested, the key may simply be destroyed.

Computer System

Figure 12:
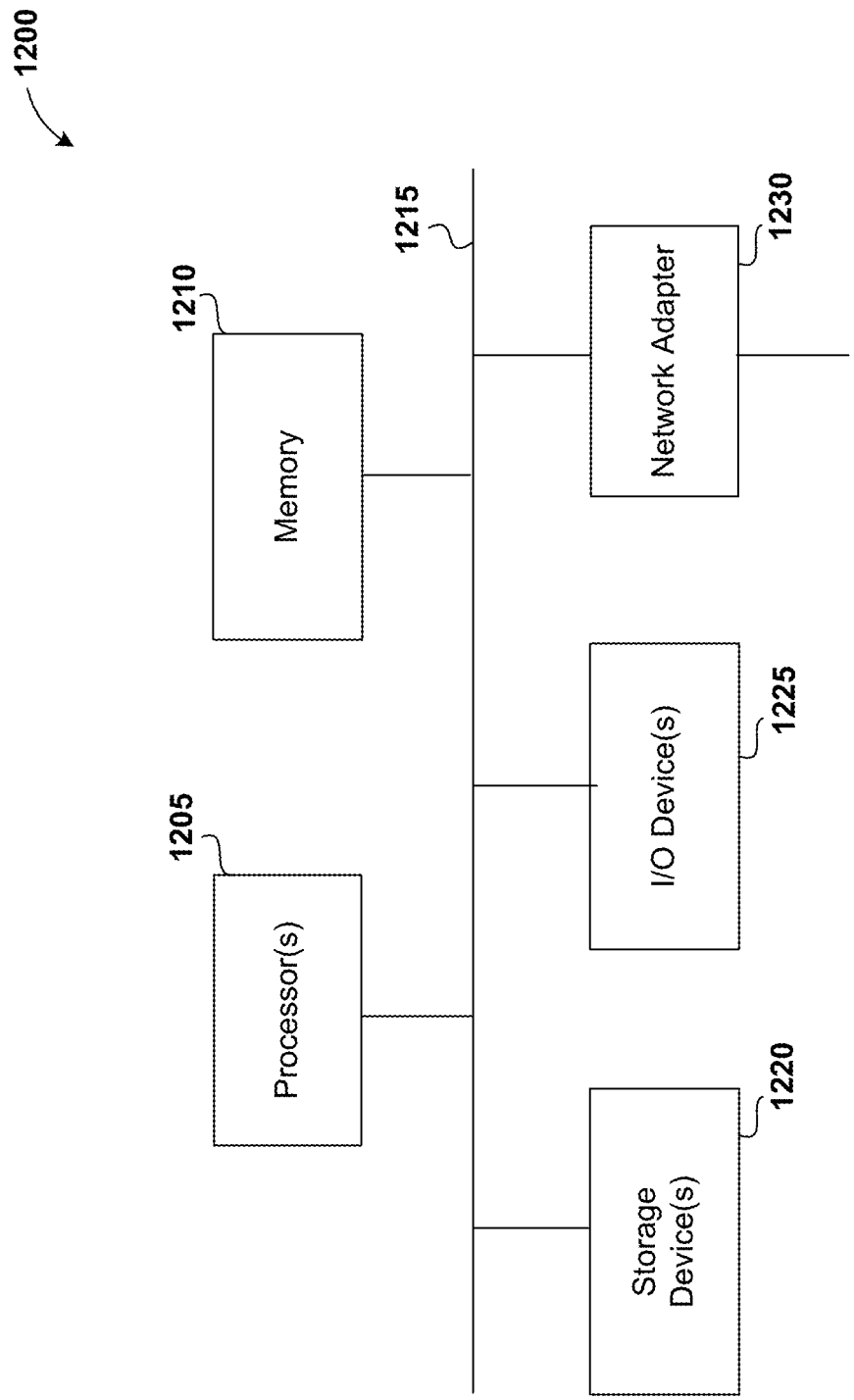
FIG. 12 is a block diagram of a computer system as may be used to implement features of some of the embodiments.

FIG. 12 is a block diagram of a computer system as may be used to implement features of some of the embodiments. The computing system 1200 may include one or more central processing units ("processors") 1205, memory 1210, input/output devices 1225 (e.g., keyboard and pointing devices, display devices), storage devices 1220 (e.g., disk drives), and network adapters 1230 (e.g., network interfaces) that are connected to an interconnect 1215. The interconnect 1215 is illustrated as an abstraction that represents any one or more separate physical buses, point to point connections, or both connected by appropriate bridges, adapters, or controllers. The interconnect 1215, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 1210 and storage devices 1220 are computer-readable storage media that may store instructions that implement at least portions of the various embodiments. In addition, the data structures and message structures may be stored or transmitted via a data transmission medium, e.g., a signal on a communications link. Various communications links may be used, e.g., the Internet, a local area network, a wide area network, or a point-to-point dial-up connection. Thus, computer readable media can include computer-readable storage media (e.g., "non transitory" media) and computer-readable transmission media.

The instructions stored in memory 1210 can be implemented as software and/or firmware to program the processor(s) 1205 to carry out actions described above. In some embodiments, such software or firmware may be initially provided to the processing system 1200 by downloading it from a remote system through the computing system 1200 (e.g., via network adapter 1230).

The various embodiments introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Remarks

The above description and drawings are illustrative and are not to be construed as limiting. Numerous specific details are described to provide a thorough understanding of the disclosure. However, in certain instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given above. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

What is claimed is:

1. A computer-implemented method for transferring data to an optical data storage system, comprising:
    dividing a file stored in a primary storage into multiple chunks, the multiple chunks including at least a first chunk and a second chunk;
    transferring the multiple chunks onto multiple optical disks, at least the first chunk and the second chunk on different optical disks of the multiple optical disks;
    maintaining a database for storing file allocation information for association between the multiple chunks and the multiple optical disks; and
    in response to the file allocation information of the database being unavailable, rebuilding the database including the file allocation information based on information stored in headers or footers appended to the multiple chunks stored on the multiple optical disks, wherein a header of the first chunk includes information of one or more of the multiple optical disks where at least some of the multiple chunks of the file are stored.

2. The computer-implemented method of claim 1, wherein encoding at least one of the chunks comprises applying a Reed-Solomon encoding.

3. The computer-implemented method of claim 1, the method further comprising deleting the file from the primary storage system.

4. The computer-implemented method of claim 1, the method further comprising associating each of the chunks with one or more logical volumes, each logical volume associated with one or more physical volumes, and each physical volume associated with one or more optical disks.

5. The computer-implemented method of claim 1, the method further comprising constructing a plan for a plurality of migration workers.

6. The computer-implemented method of claim 5, wherein a migration worker performs the placing of at least some of the chunks on the optical disks.

7. A non-transitory computer-readable medium comprising instructions configured to cause one or more computer processors to perform a method, comprising:
    dividing a file stored in a primary storage into a multiple chunks, the multiple chunks including at least a first chunk and a second chunk;
    transferring the multiple chunks onto multiple optical disks, at least the first chunk and the second chunk on different optical disks of the multiple optical disks;
    maintaining a database for storing file allocation information for association between the multiple chunks and the multiple optical disks; and
    in response to the file allocation information of the database being unavailable, rebuilding the database including the file allocation information based on information stored in headers or footers appended to the multiple chunks stored on the multiple optical disks, wherein a header of the first chunk includes information of one or more of the multiple optical disks where at least some of the multiple chunks of the file are stored.

8. The non-transitory computer-readable medium of claim 7, wherein encoding at least one of the chunks comprises applying a Reed-Solomon encoding.

9. The non-transitory computer-readable medium of claim 7, the method further comprising deleting the file from the primary storage system.

10. The non-transitory computer-readable medium of claim 7, the method further comprising associating each of the chunks with one or more logical volumes, each logical volume associated with one or more physical volumes, and each physical volume associated with one or more optical disks.

11. The non-transitory computer-readable medium of claim 7, the method further comprising constructing a plan for a plurality of migration workers.

12. The non-transitory computer-readable medium of claim 11, wherein a migration worker performs the placing of at least some of the chunks on the optical disks.

13. A computer storage system, comprising:
- an optical storage system comprising multiple optical disks;
- an interface component configured to receive a file for storage in the optical storage system, the interface component configured to create a plan for one or more migration workers to fulfill, wherein the plan includes file allocation information for association between multiple chunks of the file and the multiple optical disks;
- a database for storing the plan for the one or more migration workers to fulfill;
- a migration worker configured to transfer the multiple chunks onto the multiple optical disks, wherein at least a first chunk and a second chunk of the multiple chunks are stored on different optical disks of the multiple optical disks, and wherein a header of the first chunk includes information of one or more of the multiple optical disks where at least some of the multiple chunks of the file are stored.

14. The computer storage system of claim 13, wherein headers or footers appended to the multiple chunks stored on the optical disks include the file allocation information for rebuilding the database.

15. The computer storage system of claim 13, further comprising:
- a database rebuilding component configured to rebuild the database including the file allocation information based on information stored in headers or footers appended to the multiple chunks stored on the multiple optical disks, in response to the database being unavailable.

16. The computer storage system of claim 13, wherein the optical storage system comprises a plurality of readers.

17. The computer storage system of claim 13, wherein the interface component is configured to Reed-Solomon encode a plurality of data chunks.

18. The computer storage system of claim 13, the system further comprising an anti-entropy scanner configured to identify errors in the optical disks.

* * * * *